United States Patent
Hsueh et al.

(10) Patent No.: US 7,948,848 B2
(45) Date of Patent: May 24, 2011

(54) REPRODUCTION DATA RECORDING METHODS

(75) Inventors: Ching-Wen Hsueh, Yilan County (TW); Li-Lien Lin, Hsinchu (TW)

(73) Assignee: Mediatek Inc., Hsin-Chu (TW)

( * ) Notice: Subject to any disclaimer, the term of this patent is extended or adjusted under 35 U.S.C. 154(b) by 405 days.

(21) Appl. No.: 12/101,281

(22) Filed: Apr. 11, 2008

(65) Prior Publication Data
US 2009/0257331 A1    Oct. 15, 2009

(51) Int. Cl.
*G11B 11/00* (2006.01)
(52) U.S. Cl. ............ 369/53.35; 369/47.32; 369/53.31
(58) Field of Classification Search .............. None
See application file for complete search history.

(56) References Cited

U.S. PATENT DOCUMENTS

| | | | | |
|---|---|---|---|---|
| 2003/0097632 | A1* | 5/2003 | Marconetti | 714/784 |
| 2007/0061691 | A1* | 3/2007 | Lin et al. | 714/800 |
| 2009/0257331 | A1* | 10/2009 | Hsueh et al. | 369/47.32 |

* cited by examiner

*Primary Examiner* — Joseph Haley
*Assistant Examiner* — Ifedayo Iluyomade
(74) *Attorney, Agent, or Firm* — Thomas|Kayden

(57) ABSTRACT

A reproduction data recording method for an optical storage medium. The method comprises storing additional data to a first temporary region of a memory device; reading the first recorded data from the optical storage medium and storing the first recorded data to the first temporary region; reading a data segment of the second recorded data from the optical storage medium and storing the data segment to a second temporary region of the memory device; reading the first recorded data from the first temporary region and the data segment from the second temporary region, and decoding the first recorded data and the data segment to confirm accuracy of the first recorded data; reading the first recorded data and the additional data from the first temporary region, and encoding the first recorded data and the additional data to generate encoded data; and writing the encoded data to the optical storage medium.

19 Claims, 7 Drawing Sheets

REPRODUCTION DATA RECORDING METHODS

BACKGROUND OF THE INVENTION

1. Field of the Invention

The invention relates to methods for recording data to a high-density recording medium, and more particularly to methods for random sector writing data to a Blu-ray disc (BD).

2. Description of the Related Art

Optical discs are a widely used recording medium capable of containing a large amount of data. Particularly, there has recently been developed a high-density optical recording medium capable of recording/storing high-quality video data and high-quality audio data for long periods of time, for example, a Blu-ray disc (BD).

The BD is considered to be the next-generation optical recording solution capable of storing much more data than a conventional DVD. Blu-ray discs utilize picket code error correction. FIG. 1 is a schematic representation of the Blu-ray disc picket code. The pickets are columns inserted between columns of the main data at regular intervals. The main data is protected by a strong and efficient Reed Solomon code, and the pickets are protected by a second, independent and extremely strong Reed Solomon code. When decoding, first the picket columns are corrected. The correction information can be used to estimate the location of possible burst errors in the main data. The symbols at these locations (i.e. the location shown by the bold lines near the pickets symbols 'X') can be flagged as erasure when correcting the code words for the main data. This strategy of applying erasures is shown in FIG. 1.

A Blu-ray disc error correction block (ECC block) can store 64 kilobytes of user data. By specification standard, the data is protected by long distance code (LDC) which has 304 code words with 216 information symbols and has 32 parity symbols with a code word of length 248. These code words are interleaved two by two in the vertical direction such that a block of 152 bytes (i.e. there are four 38-bytes data)×496 bytes is formed as shown in FIG. 1. A Blu-ray disc ECC block contains 4 equally spaced picket columns. The leftmost picket (symbol 'S') is formed by the sync patterns at the start of each row. If the sync pattern is not detected properly, it may be an indication of a burst error, indicating that a symbol of a picket column must be corrected.

The other three pickets are protected by burst indicator subcode (BIS code). This BIS code has code words with 30 information symbols and 32 parity symbols giving a code word length of 62. The BIS code words are interleaved into three columns of 496 bytes each. Note that LDC code and the BIS code are two types of codes of Blu-ray disc, and both LDC code and the BIS code have the same number of parity symbols per code word and therefore only one Reed Solomon decoder is required to decode both codes.

BD-R supports random recording mode, or "random sector write". It is possible to record user data randomly on a BD-R disc on a 64 Kbytes ECC Cluster basis. The BD-R drive applies a space bit map (SBM) to manage recorded/unrecorded areas during the random recording mode.

FIG. 2 shows DRAM mapping of the Blu-ray disc. According to the Blu-ray Specification standard, the minimum recording unit for Blu-ray disc is a data cluster 10, which comprises 32 data sectors (X.0~X.31), or 304 code words (cw.0~cw.303). In FIG. 2, two data sectors comprise 19 code words. Using data sectors X.0 and X.1 as an example, code words cw.0~cw.8 belong to data sector X.0, code words cw.10~cw.18 belong to data sector X.1, the left side of code word cw.9 belongs to data sector X.0, and the right side of code word cw.9 belongs to data sector X.1. Here, the length of each code word is 248 bytes, therefore the length of code word cw.9 belongs to data sector X.0 is 108 bytes, and that belonging to data sector X.1 is 140 bytes. Moreover, the length of each code word (248 bytes) includes 32 bytes of parity codes for generating the syndrome, therefore the code words amount of a data sector for storing is (248−32)×9+ 108−4 (EDC codes, not shown)=2048 codes.

The data sectors in the data cluster can be replaced with newly added data sectors by random sector writing. For example, additional data sectors NX.1 and NX.30 (not shown) can be recorded to the Blu-ray disc at the position respectively corresponding to data sectors X.1 and X.30 in the data cluster 10. FIG. 3 is a flowchart illustrating writing of additional data sectors NX.1 and NX.30 to the data cluster 10 by a conventional method. First, a template region is allocated from a memory device to store additional data sectors NX.1 and NX.30 (step S1). Next, data sectors X.0, X.1~X.31 are read from the Blu-ray disc and stored to the memory device for decoding to confirm accuracy of data sectors X.0, X.1~X.31 (step S2). Next, additional data sectors NX.1 and NX.30 are stored to data cluster 10, and data sectors X.1 and X.30 are replaced with additional data sectors NX.1 and NX.30 (step S3). Than, data cluster 10 comprising data sectors X.0, X.2-X.29 and X.31, and additional data sectors NX.1 and NX.30 are encoded (step S4). Finally, the encoded data is recorded to the Blu-ray disc (step S5).

However, the conventional method requires addition of a template region of memory for storing entire data sectors NX.1 and NX.30, which consumes memory space. In addition, the conventional method must replace the original data sectors X.1 and X.30 with data sectors NX.1 and NX.30 at step S3, which consumes memory bandwidth.

BRIEF SUMMARY OF THE INVENTION

Reproduction data recording methods for an optical storage medium are provided. An exemplary embodiment of a reproduction data recording method for an optical storage medium storing a data cluster divided into a plurality of code words and comprising first recorded data and second recorded data. The method comprises storing additional data to a first temporary region of a memory device, reading the first recorded data from the optical storage medium and storing the first recorded data to the first temporary region, reading a data segment of the second recorded data from the optical storage medium and storing the data segment to a second temporary region of the memory device, reading the first recorded data from the first temporary region and the data segment from the second temporary region, and decoding the first recorded data and the data segment to confirm accuracy of the first recorded data, reading the first recorded data and the additional data from the first temporary region, and encoding the first recorded data and the additional data to generate encoded data, and writing the encoded data to the optical storage medium.

Another exemplary embodiment of a reproduction data recording method for an optical storage medium storing a data cluster divided into a plurality of code words and comprising first recorded data and second recorded data, wherein the code words are grouped into first code words comprising the first recorded data and the second recorded data, and second code words comprising only the first recorded data or the second recorded data, the method comprises storing additional data to a first temporary region of a memory device, reading the first recorded data from the optical storage medium and storing the first recorded data to the first temporary region, calculating first syndrome data corresponding to the first code words, storing the first syndrome data to a second temporary region of the memory device, calculating second syndrome data corresponding to the second code word, reading the first syndrome data and the second syndrome data for decoding to confirm accuracy of the first recorded data, encoding the first recorded data and the additional data to generate encoded data, and writing the encoded data to the optical storage medium.

Another exemplary embodiment of a method for an optical storage medium storing a data cluster, the method comprises storing additional data sector to a first temporary region of a memory device, reading the data cluster from the optical storage medium, storing a first recorded data and a second recorded data of the data cluster respectively to the first temporary region and a second temporary region of the memory device, wherein a storing region in the first temporary region corresponding to the second recorded data is occupied by the additional data sector, confirming accuracy of the first recorded data by receiving the first recorded data and a data segment of the second recorded data, encoding the first recorded data and the additional data sector from the first temporary region to generate encoded data, and writing the encoded data to the optical storage medium.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 4:
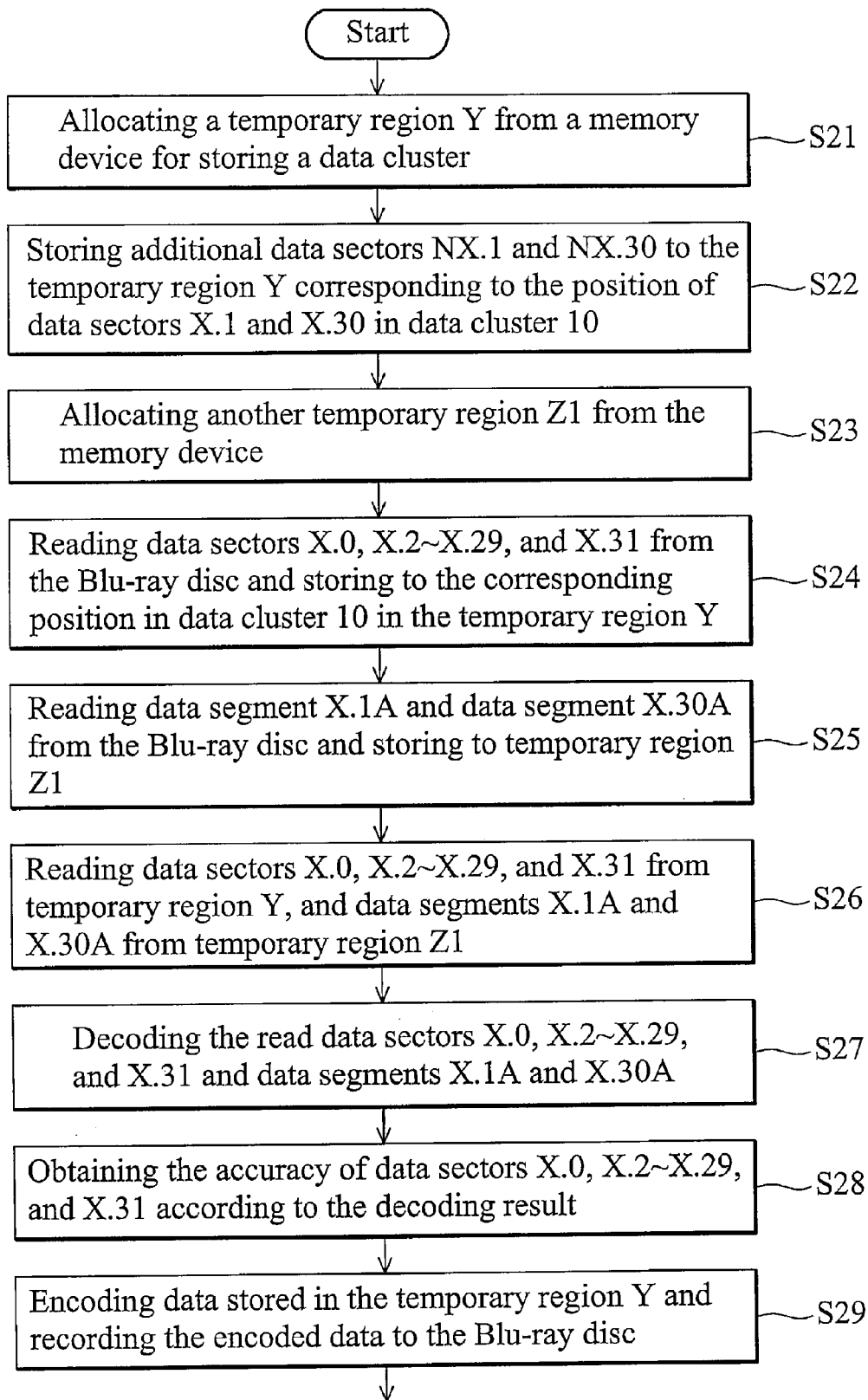
FIG. 4 is a flowchart illustrating writing of additional data sectors to the Blu-ray disc according to an embodiment of the invention.

FIG. 4 is a flowchart illustrating writing of additional data sectors to a Blu-ray disc according to an embodiment of the invention. Please refer to the FIG. 5 and FIG. 6 simultaneously. Note that the sequence of the steps of the flow charts can be exchanged and the steps can be combined together for the requirements. According to the requirement, the data size of the additional data outputted from a host device is integral multiples of that of the data sector. This embodiment utilizes two additional data sectors NX.1 and NX.30 (FIG. 6) to replace data sectors X.1 and X.30 (FIG. 5) in data cluster 10 recorded on the Blu-ray disc as an example. First, a temporary region Y (FIG. 6) is allocated from a memory device for storing a data cluster (step S21). Here, the memory device can be a dynamic random access memory (DRAM).

Figure 5:
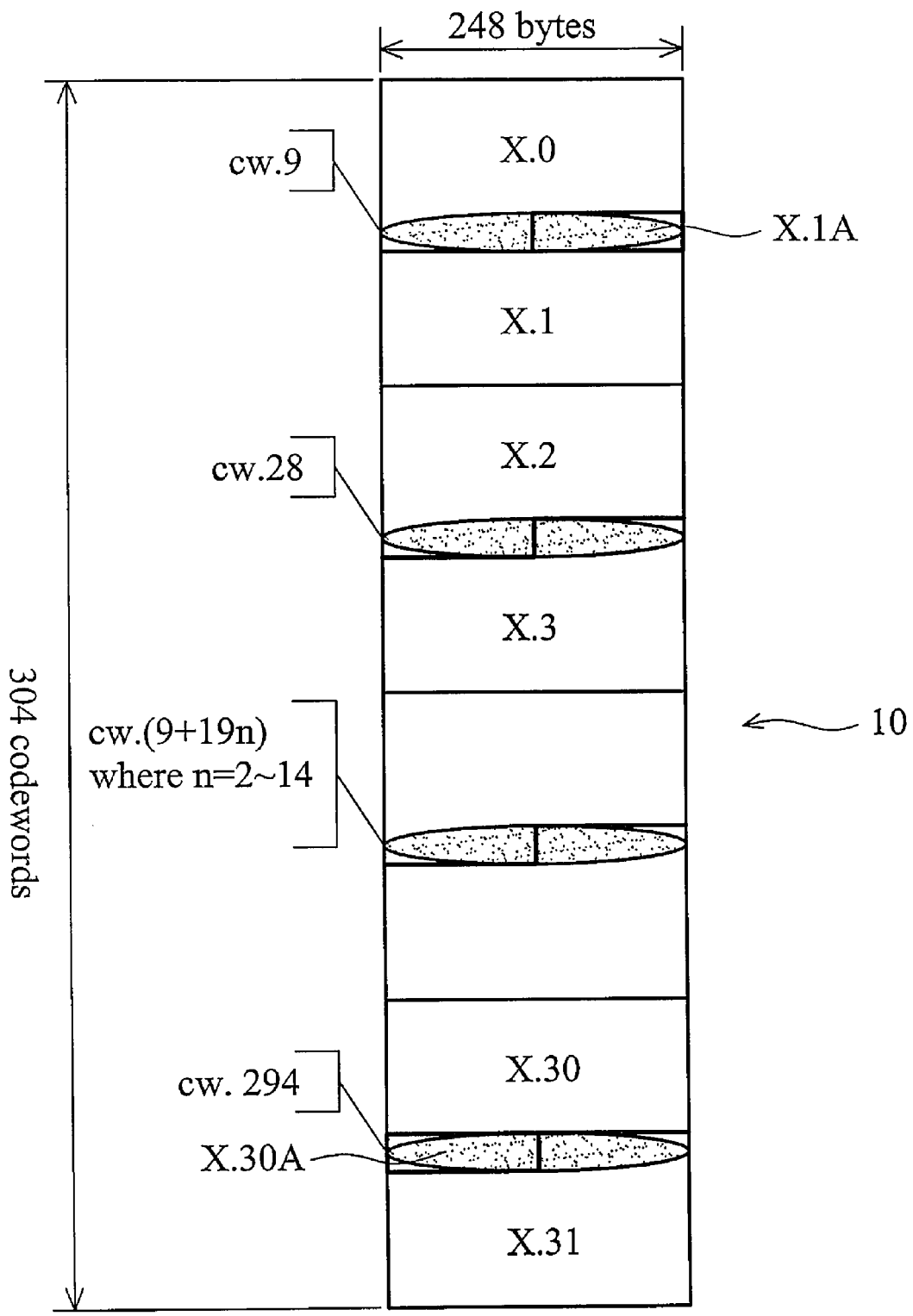
FIG. 5 shows the data structure of data cluster 10 shown in FIG. 2.

FIG. 5 shows the data structure of data cluster 10 used in FIG. 4. Data cluster 10 is divided into 32 data sectors (X.0~X.31) or 304 code words (cw.0~cw.303) with length 248 bytes, in other words, two data sectors comprise 19 code words. In addition, data cluster 10 is divided into first recorded data, and second recorded data to be replaced by random sector write. In this embodiment, first recorded data is data sectors X.0, X.2~X.29, and X.31, and second recorded data is data sectors X.1 and X.30. Thus, the size of temporary region Y can be 75392 bytes (248 bytes×304).

Figure 6:
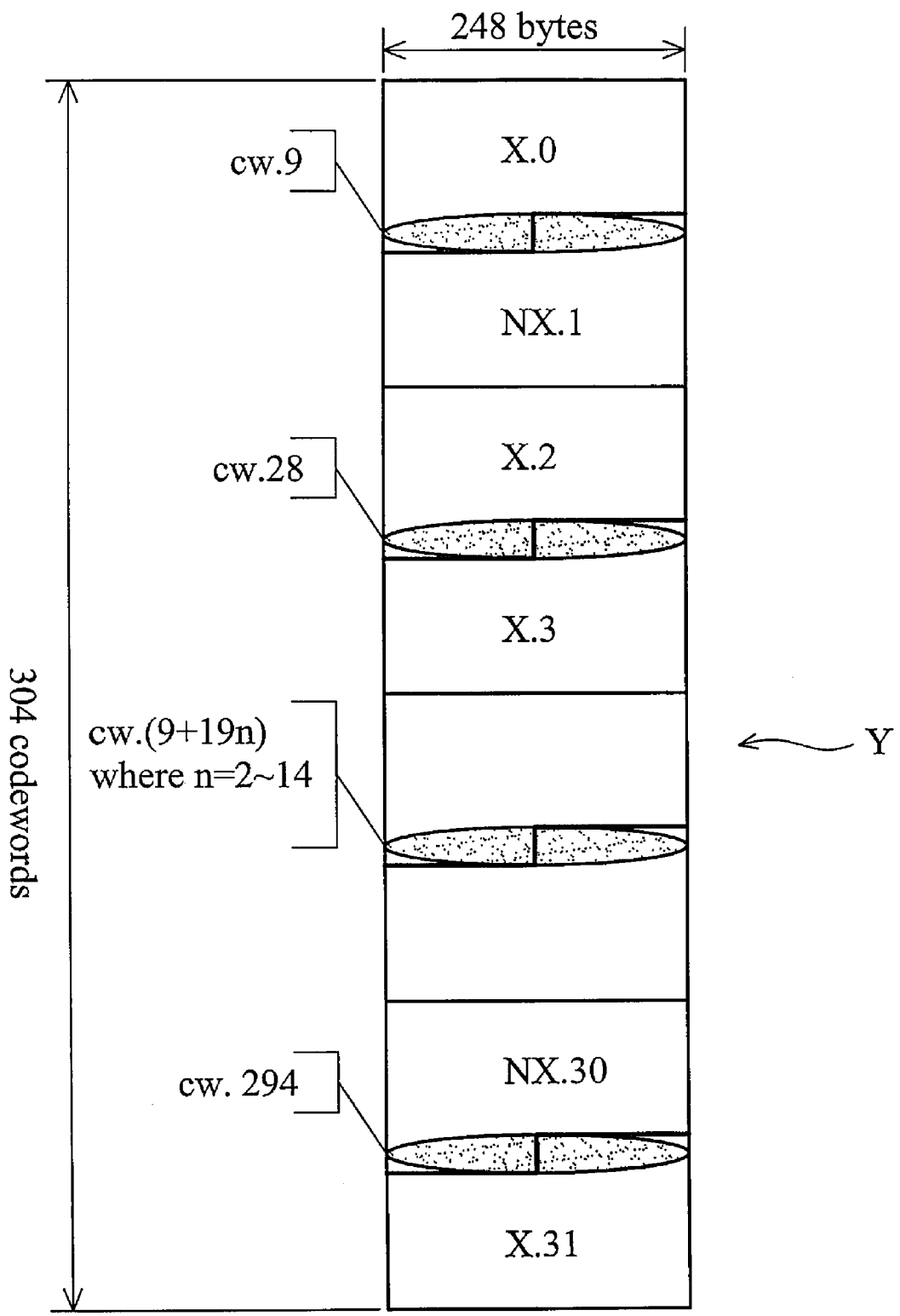
FIG. 6 shows the data stored in the temporary region Y according to an embodiment of the invention.

FIG. 6 shows the data sectors stored in the temporary region Y. Additional data sectors NX.1 and NX.30 from the host device are stored to the temporary region Y corresponding to the position of data sectors X.1 and X.30 in data cluster 10 (step S22). Note that the sequence of the steps of the flow charts can be exchanged or merged. For example, the execution priority of steps S21~S24 can be changed according to the design requirements. Therefore, first recorded data (data sectors X.0, X.2~X.29, and X.31) are read from the Blu-ray disc and stored to the positions in the temporary region Y, wherein the positions to be stored correspond to the positions of data sectors X.0, X.2~X.29, and X.31 in data cluster 10 (step S24). The data sectors stored in the temporary region Y are shown in FIG. 6.

On the other hand, since the second recorded data (X.1 and X.30) will be replaced by the additional data sectors NX.1 and NX.30 from random sector write, thus in order to keep the data segment X.1A in code word cw.9 of data sector X.1 and the data segment X.30A in code word cw.294 of data sector X.30, another temporary region Z1 (not shown) is allocated from the memory device (step S23) for saving the data segment X.1A and the data segment X.30A. Namely, data segment X.1A of data sector X.1 and data segment X.30A of data sector X.30 are read from the Blu-ray disc and stored to temporary region Z1 (step S25) for decoding to confirm the accuracy. From the description above, (9+19n)th code words are stored in the temporary region Y, wherein n=0~15. However, when the code words are in the data sectors which will be replaced (such as n=0 and 15 in this embodiment), the replaced part (such as data sector X.1 and data segment X.30A) will be stored to another region (such as the temporary region Z1).

Figure 1:
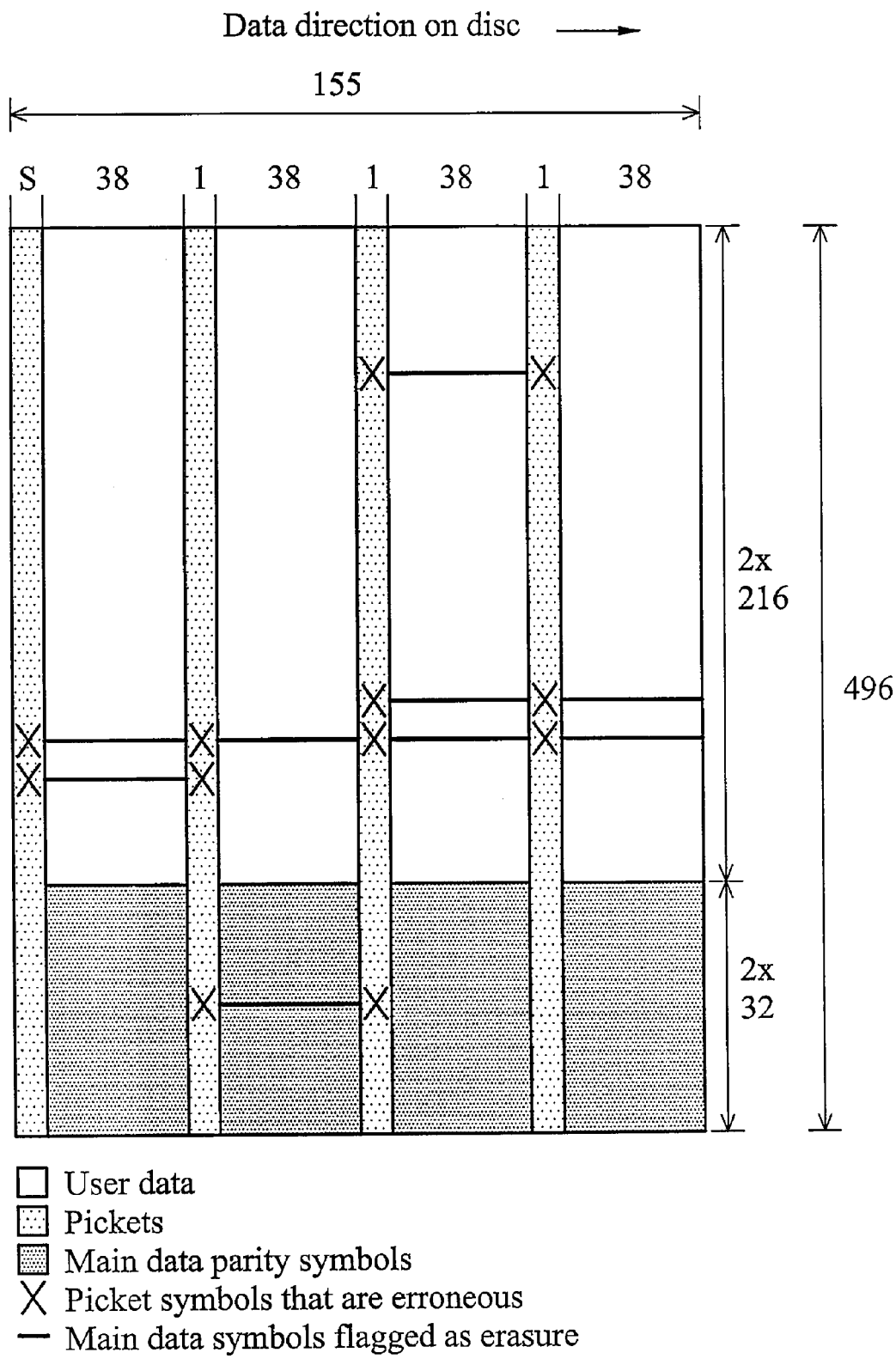
FIG. 1 is a flowchart showing a conventional next writable address locating method.
Figure 2:
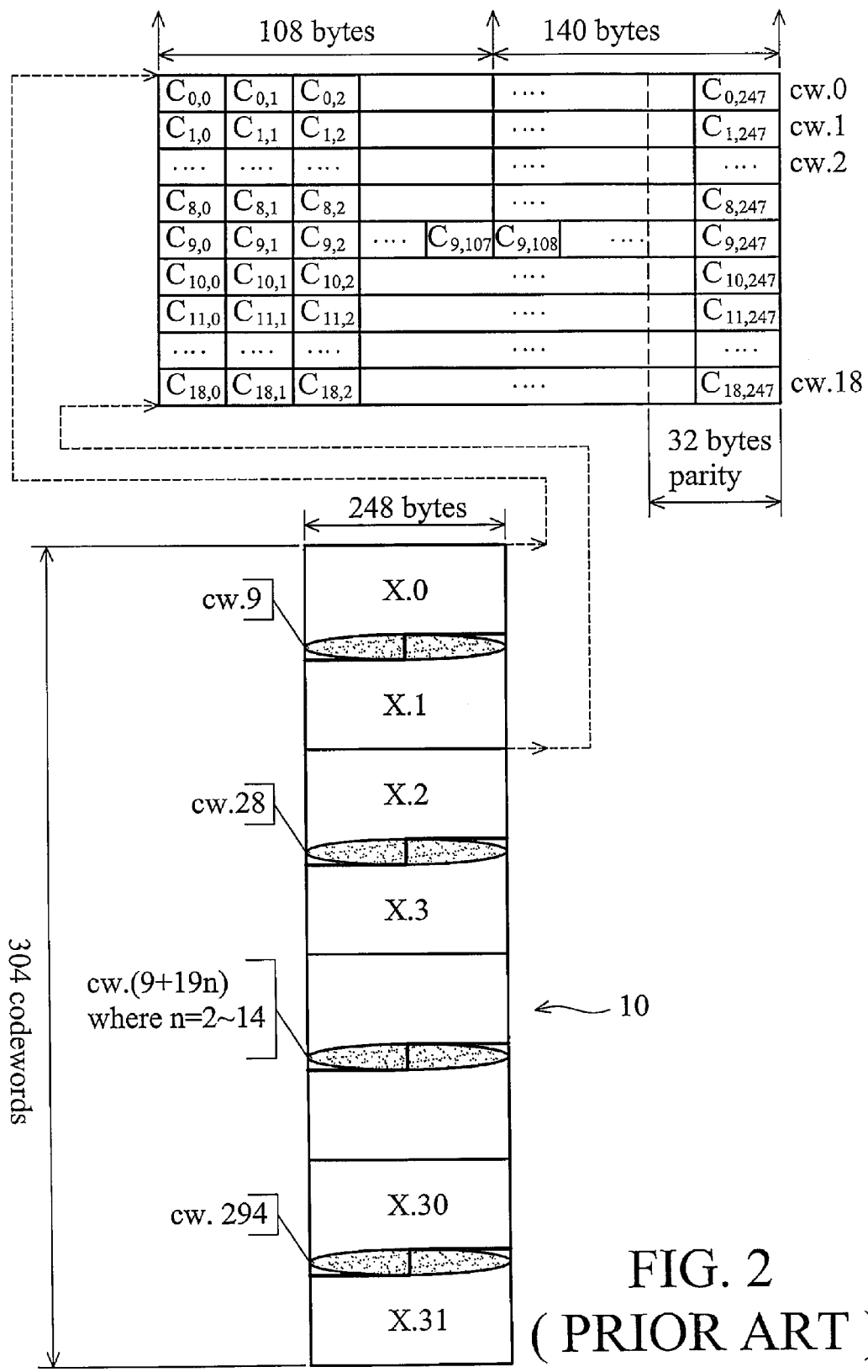
FIG. 2 is a block diagram of an optical recording apparatus according to an embodiment of the invention.

Here, refer to the FIG. 2 and FIG. 5 simultaneously, data segment X.1A of data sector X.1 with data length 140 bytes is located in the right side of code word cw.9, and data segment X.30A with data length 108 bytes of data sector X.30 is located in the left side of code word cw.294. To confirm accuracy of data sectors X.0, X.2~X.29, and X.31, entire data in a code word comprising data sectors X.0, X.2~X.29, and X.31 should be obtained. Thus, data sectors X.0, X.2~X.29, and X.31 are read from temporary region Y, and data segments X.1A and X.30A are read from temporary region Z1 (step S26).

Moreover, the read data sectors X.0, X.2~X.29, X.31, and data segments X.1A and X.30A are decoded (step S27). After decoding data sectors X.0, X.2~X.29, and X.31 and data segments X.1A and X.30A, the accuracy of data sectors X.0, X.2~X.29, and X.31 is obtained according to the decoding result (step S28). Next, as the accuracy of data sectors X.0, X.2~X.29, and X.31 is confirmed, data stored in the temporary region Y is encoded by error correction coding to obtain the encoded data, and the encoded data is recorded to the Blu-ray disc (step S29).

Figure 3:
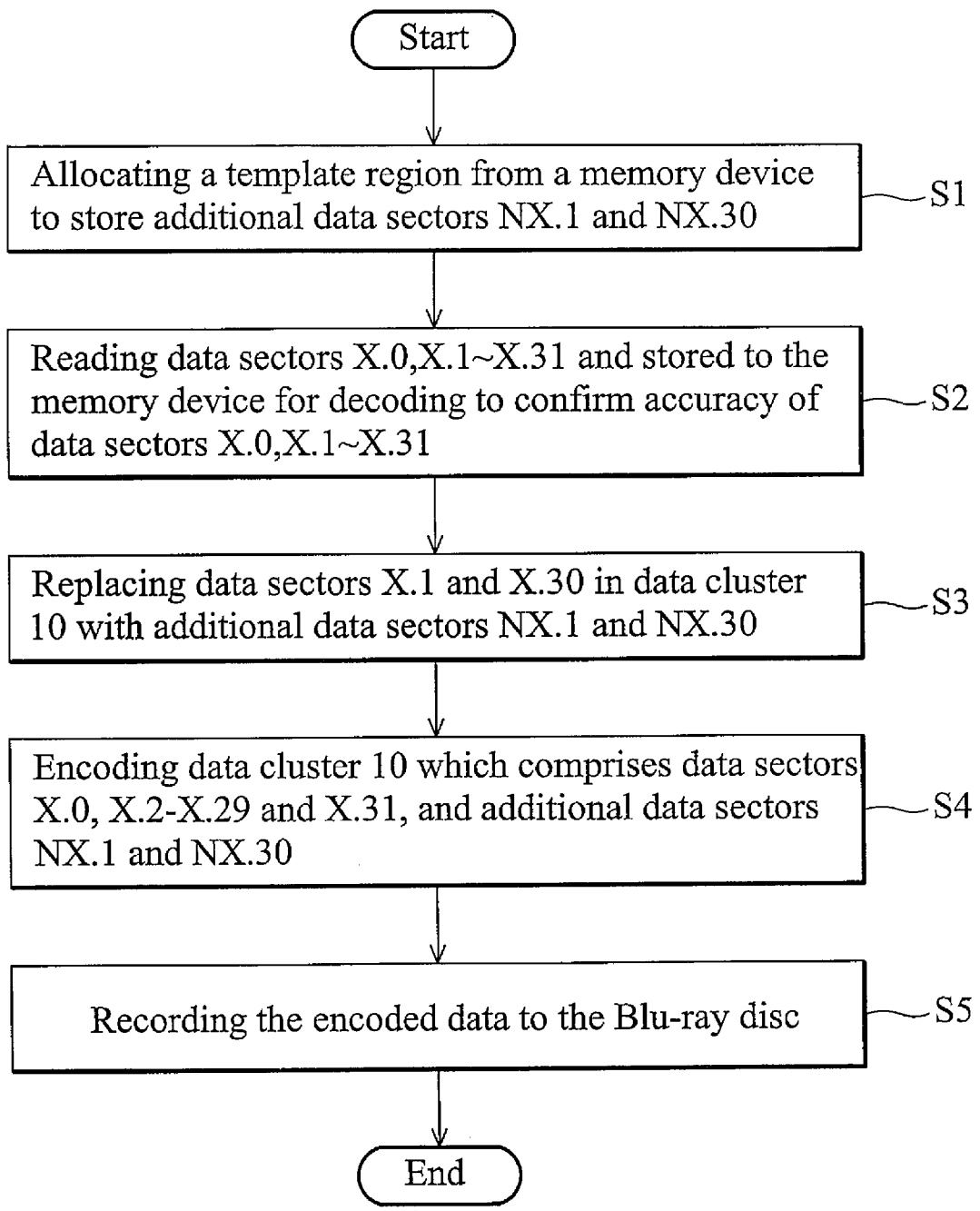
FIG. 3 is a flowchart illustrating writing of additional data sectors to the data cluster by a conventional method.

According to the embodiment, the additional data sectors NX.1, NX.30 and the original data sectors X.0, X.2~X.29, X.31 are allocated in the same region (temporary region Y), therefore it only needs allocate the temporary region Z1 with 140 bytes (data segments X.1A) or 108 bytes (data segments X.30A) for storing the data segment. However, the conventional method (FIG. 3) requires 2048 bytes for storing the entire data sector. Thus, memory requirement for recording a new data sector to replace data in a Blu-ray disc is decreased.

Figure 7:
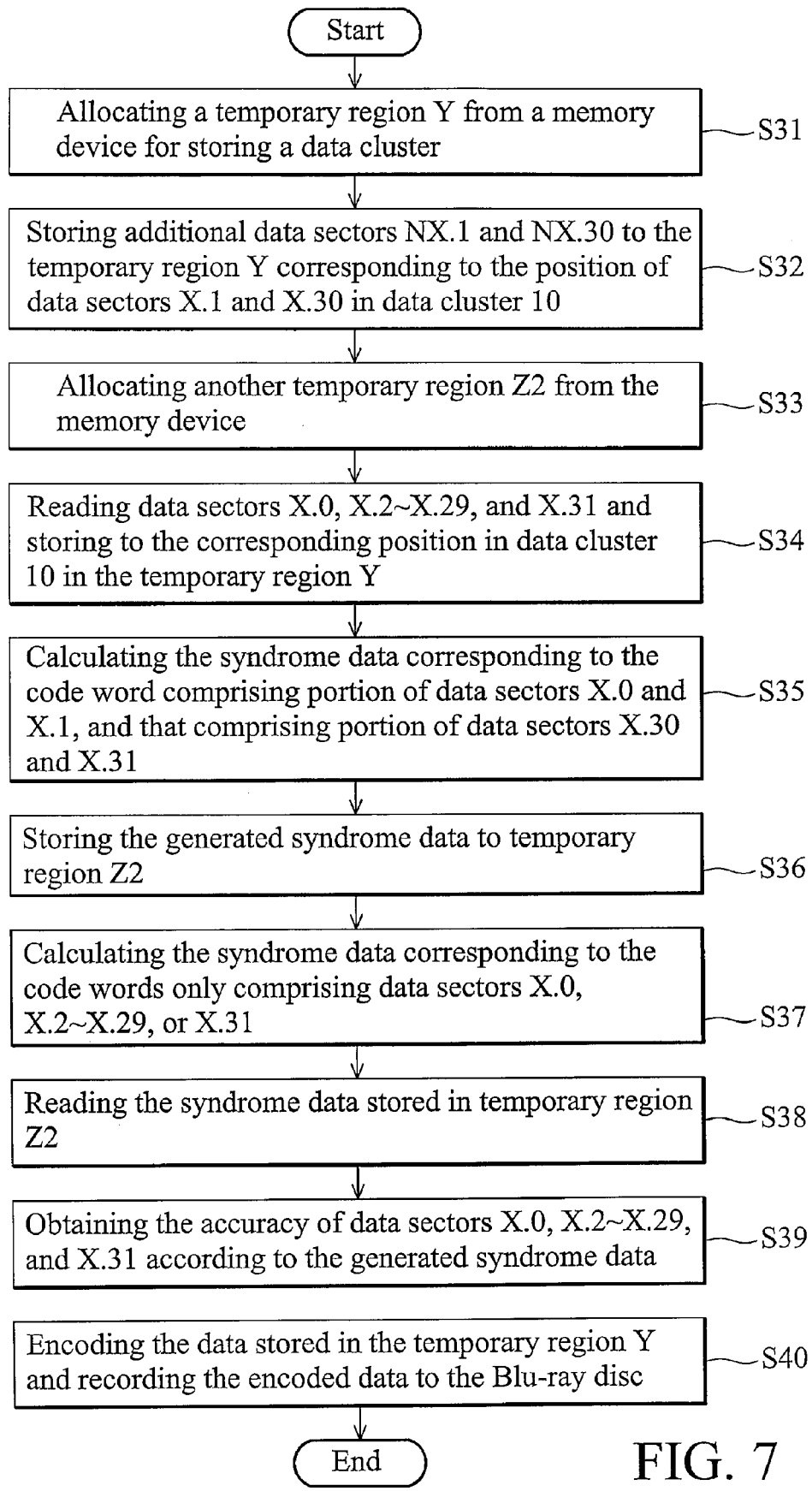
FIG. 7 is a flowchart illustrating writing of additional data sectors to the Blu-ray disc according to another embodiment of the invention.

FIG. 7 is a flowchart illustrating writing of additional data sectors to the Blu-ray disc according to another embodiment of the invention. Please refer to the FIG. 5 and FIG. 6 simultaneously. This embodiment utilizes two additional data sectors NX.1 and NX.30 to replace data sectors X.1 and X.30 in data cluster 10 recorded on the Blu-ray disc as an example. First, a temporary region Y is allocated from a memory device for storing a data cluster (step S31). Here, the memory device can be a dynamic random access memory (DRAM).

FIG. 5 shows the data structure of data cluster 10 used in FIG. 7. Data cluster 10 is divided into 32 data sectors (X.0~X.31) or 304 code words (cw.0~cw.303) with length 248 bytes, in other words, two data sectors comprise 19 code words. In addition, data cluster 10 can be divided into first recorded data, and second recorded data to be replaced by random sector write, and the code words are grouped into first code words comprising portion of the first recorded data and the second recorded data, and second code words comprising only the first recorded data or the second recorded data. Thus, as shown in FIG. 6, the size of temporary region Y can be 75392 bytes (248 bytes×304). In this embodiment, first recorded data is data sectors X.0, X.2~X.29, and X.31, second recorded data is data sectors X.1 and X.30, first code words are cw.9 and cw.294, and second code words are cw.(9+19n) where n=2~14. Next, additional data sectors NX.1 and NX.30 are stored to the temporary region Y corresponding to the position of data sectors X.1 and X.30 to be replaced in data cluster 10 (step S32).

Next, another temporary region Z2 is allocated from the memory device (step S33). Then, first recorded data (data sectors X.0, X.2~X.29, and X.31) are read from the Blu-ray disc and stored to the corresponding position of data sectors X.0, X.2~X.29, and X.31 in data cluster 10 in the temporary region Y (step S34). The data sectors stored in the temporary region Y is shown in FIG. 6. Note that the temporary region Y can be seen as a first temporary region, and other part of the memory device without the temporary region Y (such as the temporary regions Z1 and Z2 mentioned above) can be seen as a second temporary region.

Next, the syndrome data (first syndrome data) corresponding to the first code word is calculated (step S35). For example, the syndrome data corresponding to the code word comprising portion of data sectors X.0 and X.1, and the code word comprising portion of data sectors X.30 and X.31 is calculated. In this embodiment, the syndrome data corresponding to code words cw.9 and cw.294 is generated, and then stored to temporary region Z2 (step S36). In an embodiment of the invention, the size of syndrome data corresponding to each code word can be 32 bytes.

To confirm accuracy of data sectors X.0, X.2~X.29, and X.31, the syndrome data (second syndrome data) corresponding to the second code words is calculated (step S37). For example, the second code words comprise the code words in data sectors X.0, X.2~X.29, and X.31, other than code words cw.9 and cw.294. Next, the syndrome data corresponding to code words cw.9 and cw.294 is read from temporary region Z2 (step S38). Thus, the accuracy of data sectors X.0, X.2~X.29, and X.31 is obtained according to the syndrome data generated in steps S35 and S37 (step S39). Next, as the accuracy of data sectors X.0, X.2~X.29, and X.31 is confirmed, data stored in the temporary region Y is encoded by error correction coding to obtain the encoded data, and the encoded data is recorded to the Blu-ray disc (step S40), and second code words are cw.(9+19n) where n=2~14.

When confirming the accuracy (step S39), it needs to read the first syndrome data corresponding to first code words (i.e. cw.9 and cw.294) from the second temporary region (i.e. temporary region Z2), and decoding the first syndrome data and the second syndrome data to confirm accuracy of the first recorded data (i.e. data sectors X.0, X.2~X.29, and X.31). Then, the first recorded data and the additional data (NX.1 and NX.30) is read from the first temporary region (temporary region Y), and the first recorded data and the additional data are encoded to generate encoded data for the writing step (step S40).

Thus, the method is used for an optical storage medium to store a data cluster. Firstly, additional data sectors NX.1 and NX.30 are stored to a first temporary region (i.e. region Y) of a memory device, and the data cluster is read from the optical storage medium. Then a first recorded data X.0, X.2~X.29 and X.31 and a second recorded data X.1, X.30 of the data cluster are respectively stored to the first temporary region (i.e. region Y) and a second temporary region (i.e. Z1 or Z2) of the memory device, wherein a storing region in the first temporary region (i.e. region Y) corresponding to the second recorded data X.1, X.30 is occupied by the additional data NX.1, NX.30. Therefore, accuracy of the first recorded data X.0, X.2~X.29 and X.31 can be confirmed by receiving the first recorded data X.0, X.2~X.29, X.31, and a data segments X.1A, X.30A of the second recorded data X.1 and X.30. After confirming the accuracy, first recorded data X.0, X.2~X.29, X.31 and the additional data NX.1, NX.30 stored in the first temporary region (i.e. region Y) are encoded the to generate encoded data; and finally the encoded data is written to the optical storage medium.

According to the embodiment, the size of the temporary region Z2 allocated from the memory device for storing the syndrome data is only 32 bytes, but the conventional method requires 2048 bytes for storing entire data sector. Thus, memory requirement for recording a new data sector to replace data in a Blu-ray disc is decreased.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A reproduction data recording method for an optical storage medium storing a data cluster divided into a plurality of code words and comprising first recorded data and second recorded data, the method comprising:

storing additional data to a first temporary region of a memory device;

reading the first recorded data from the optical storage medium and storing the first recorded data to the first temporary region;

reading a data segment of the second recorded data from the optical storage medium and storing the data segment to a second temporary region of the memory device;

reading the first recorded data from the first temporary region and the data segment from the second temporary region, and decoding the first recorded data and the data segment to confirm an accuracy of the first recorded data;

reading the first recorded data and the additional data from the first temporary region, and encoding the first recorded data and the additional data to generate encoded data; and writing the encoded data to the optical storage medium.

2. The reproduction data recording method as claimed in claim 1, wherein the size of the additional data is integral multiples of that of the data sector.

3. The reproduction data recording method as claimed in claim 1, wherein the memory device is a dynamic random access memory.

4. The reproduction data recording method as claimed in claim 1, wherein the first recorded data and the additional data are encoded by error correction coding to obtain the encoded data.

5. The reproduction data recording method as claimed in claim 1, wherein the first recorded data and the additional data are encoded after the accuracy of the first recorded data is confirmed.

6. The reproduction data recording method as claimed in claim 1, wherein the optical storage medium is a Blu-ray disc.

7. A reproduction data recording method for an optical storage medium storing a data cluster divided into a plurality of code words and comprising first recorded data and second recorded data, wherein the code words are grouped into first code words comprising the first recorded data and the second recorded data, and second code words comprising only the first recorded data or the second recorded data, the method comprising:

storing additional data to a first temporary region of a memory device;

reading the first recorded data from the optical storage medium and storing the first recorded data to the first temporary region;

calculating first syndrome data corresponding to the first code words;

storing the first syndrome data to a second temporary region of the memory device;

calculating second syndrome data corresponding to the second code word;

reading the first syndrome data and the second syndrome data for decoding to confirm accuracy of the first recorded data;

encoding the first recorded data and the additional data to generate encoded data; and writing the encoded data to the optical storage medium.

8. The reproduction data recording method as claimed in claim 7, wherein the size of the additional data is integral multiples of that of the data sector.

9. The reproduction data recording method as claimed in claim 7, wherein a size of the first syndrome data and the second syndrome data corresponding to each code word is 32 bytes.

10. The reproduction data recording method as claimed in claim 7, wherein the memory device is a dynamic random access memory.

11. The reproduction data recording method as claimed in claim 7, wherein the first recorded data and the additional data are encoded by error correction coding to obtain the encoded data.

12. The reproduction data recording method as claimed in claim 7, wherein the first recorded data and the additional data are encoded after the accuracy of the first recorded data is confirmed.

13. The reproduction data recording method as claimed in claim 7, wherein the optical storage medium is a Blu-ray disc.

14. A method for an optical storage medium storing a data cluster, the method comprising:

storing an additional data sector to a first temporary region of a memory device;

reading the data cluster from the optical storage medium;

storing a first recorded data and a second recorded data of the data cluster respectively to the first temporary region and a second temporary region of the memory device, wherein a storing region in the first temporary region corresponding to the second recorded data is occupied by the additional data sector;

confirming an accuracy of the first recorded data by receiving the first recorded data and a data segment of the second recorded data;

encoding the first recorded data and the additional data sector from the first temporary region to generate encoded data; and writing the encoded data to the optical storage medium.

15. The reproduction data recording method as claimed in claim 14, wherein the step of confirming the accuracy comprises:

decoding the first recorded data and the data segment respectively from the first temporary region and the second temporary region to confirm the accuracy.

16. The reproduction data recording method as claimed in claim 14, wherein the step of confirming the accuracy comprises:

calculating first syndrome data corresponding to a plurality of first code words and second syndrome data corresponding to a plurality of second code words wherein the first code words comprising the first recorded data and the second recorded data, and the second code words comprising only the first recorded data or the second recorded data; and reading the first syndrome data and the second syndrome data for decoding to confirm the accuracy of the first recorded data.

17. The reproduction data recording method as claimed in claim 16, wherein the first syndrome data is stored in the second temporary region of the memory device.

18. The reproduction data recording method as claimed in claim 1, wherein the data segment is in a code word of the second recorded data.

19. The reproduction data recording method as claimed in claim 14, wherein the data segment is in a code word of the second recorded data.

* * * * *